(12) United States Patent
Sato et al.

(10) Patent No.: US 10,819,307 B2
(45) Date of Patent: Oct. 27, 2020

(54) CRYSTAL UNIT AND MANUFACTURING METHOD THEREOF

(71) Applicant: NIHON DEMPA KOGYO CO., LTD., Tokyo (JP)

(72) Inventors: Yoshiharu Sato, Saitama (JP); Tetsuya Watanabe, Saitama (JP); Hirokazu Iwata, Saitama (JP); Shinobu Yoshida, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/057,834

(22) Filed: Aug. 8, 2018

(65) Prior Publication Data

US 2019/0051814 A1    Feb. 14, 2019

(30) Foreign Application Priority Data

Aug. 9, 2017    (JP) .................................. 2017-153897

(51) Int. Cl.

| | |
|---|---|
| *H03H 9/13* | (2006.01) |
| *H01L 41/332* | (2013.01) |
| *H03B 5/32* | (2006.01) |
| *H01L 41/053* | (2006.01) |
| *H01L 41/047* | (2006.01) |

(Continued)

(52) U.S. Cl.
CPC ......... *H03H 9/132* (2013.01); *H01L 41/0477* (2013.01); *H01L 41/0533* (2013.01); *H01L 41/332* (2013.01); *H03B 5/32* (2013.01); *H03H 3/02* (2013.01); *H03H 9/02023* (2013.01); *H03H 9/177* (2013.01); *H03H 9/19* (2013.01);

(Continued)

(58) Field of Classification Search
CPC ....... H03H 9/132; H03H 9/19; H03H 9/02023
See application file for complete search history.

(56) References Cited

U.S. PATENT DOCUMENTS

| 3,437,848 A | * | 4/1969 | Borner | ..................... H03H 9/56 |
| | | | | 310/320 |
| 6,111,341 A | * | 8/2000 | Hirama | ..................... H03H 9/13 |
| | | | | 310/312 |

(Continued)

FOREIGN PATENT DOCUMENTS

| JP | 2010109526 A | * | 5/2010 |
| JP | 2012199606 A | * | 10/2012 |

(Continued)

*Primary Examiner* — Z. Jim Yang
(74) *Attorney, Agent, or Firm* — JCIPRNET

(57) ABSTRACT

A crystal unit includes an AT-cut crystal element that has a planar shape in a rectangular shape and a part as a thick portion. The crystal element includes a first end portion, a first depressed portion, the thick portion, a second depressed portion, and a second end portion in an order from a side of one short side in viewing a cross section taken along a longitudinal direction near a center of the short side. The first depressed portion is a depressed portion disposed from the thick portion toward the first end portion side, depressed with a predetermined angle θa and subsequently bulged, and connected to the first end portion. The second depressed portion is a depressed portion disposed from the thick portion toward the second end portion side, depressed with a predetermined angle θb and subsequently bulged, and connected to the second end portion.

3 Claims, 8 Drawing Sheets

(51) Int. Cl.
*H03H 9/19* (2006.01)
*H03H 3/02* (2006.01)
*H03H 9/17* (2006.01)
*H03H 9/02* (2006.01)

(52) U.S. Cl.
CPC ............... *H03B 2200/0018* (2013.01); *H03H 2003/022* (2013.01)

(56) References Cited

U.S. PATENT DOCUMENTS

| | | | |
|---|---|---|---|
| 10,141,906 B1* | 11/2018 | Chang | H03H 3/02 |
| 10,498,311 B2* | 12/2019 | Obara | H03H 9/17 |
| 2003/0006853 A1* | 1/2003 | Yamanaka | G01G 3/13 |
| | | | 331/158 |
| 2005/0200240 A1* | 9/2005 | Tanaka | H03H 9/1021 |
| | | | 310/333 |
| 2006/0001333 A1* | 1/2006 | Umeki | H03H 9/132 |
| | | | 310/320 |
| 2008/0079334 A1* | 4/2008 | Yong | H03H 9/08 |
| | | | 310/361 |
| 2010/0164325 A1* | 7/2010 | Onoe | H03H 9/19 |
| | | | 310/320 |
| 2012/0181899 A1* | 7/2012 | Koyama | H03H 9/132 |
| | | | 310/313 R |
| 2012/0212107 A1* | 8/2012 | Yamaguchi | H03H 9/02023 |
| | | | 310/353 |
| 2014/0175944 A1* | 6/2014 | Koyama | H03H 9/177 |
| | | | 310/320 |
| 2015/0229291 A1* | 8/2015 | Lim | H03H 9/19 |
| | | | 310/321 |
| 2015/0303896 A1* | 10/2015 | Lim | H03H 9/19 |
| | | | 310/361 |
| 2016/0079955 A1* | 3/2016 | Lee | H03H 9/17 |
| | | | 310/321 |
| 2016/0226444 A1* | 8/2016 | Yamashita | H03H 9/177 |
| 2016/0294356 A1* | 10/2016 | Kuwahara | H03H 9/02133 |
| 2018/0006630 A1* | 1/2018 | Kojo | H03H 9/17 |
| 2018/0083594 A1* | 3/2018 | Ibaragi | H03H 3/02 |
| 2018/0097503 A1* | 4/2018 | Yamamoto | H03H 9/13 |
| 2018/0212584 A1* | 7/2018 | Yamamoto | H03H 9/0509 |
| 2018/0212585 A1* | 7/2018 | Yamamoto | H03H 9/19 |
| 2018/0212587 A1* | 7/2018 | Yamamoto | H03H 9/02023 |
| 2018/0212588 A1* | 7/2018 | Yamamoto | H03H 9/02023 |
| 2018/0226943 A1* | 8/2018 | Kidu | H01L 41/338 |
| 2019/0207584 A1* | 7/2019 | Miyazaki | H01L 41/332 |

FOREIGN PATENT DOCUMENTS

| | | | | |
|---|---|---|---|---|
| JP | 2013138479 A | * | 7/2013 | |
| JP | 2014027505 | | 2/2014 | |
| JP | 2014027506 A | * | 2/2014 | |
| JP | 2014179773 A | * | 9/2014 | |
| JP | 2016197778 | | 11/2016 | |
| JP | 2017099025 A | * | 6/2017 | |
| WO | WO-2016121182 A1 | * | 8/2016 | H03H 9/02 |
| WO | WO-2017061591 A1 | * | 4/2017 | H03H 9/1035 |
| WO | WO-2018021296 A1 | * | 2/2018 | H03H 9/19 |

* cited by examiner

FIG. 1A
FIG. 1B
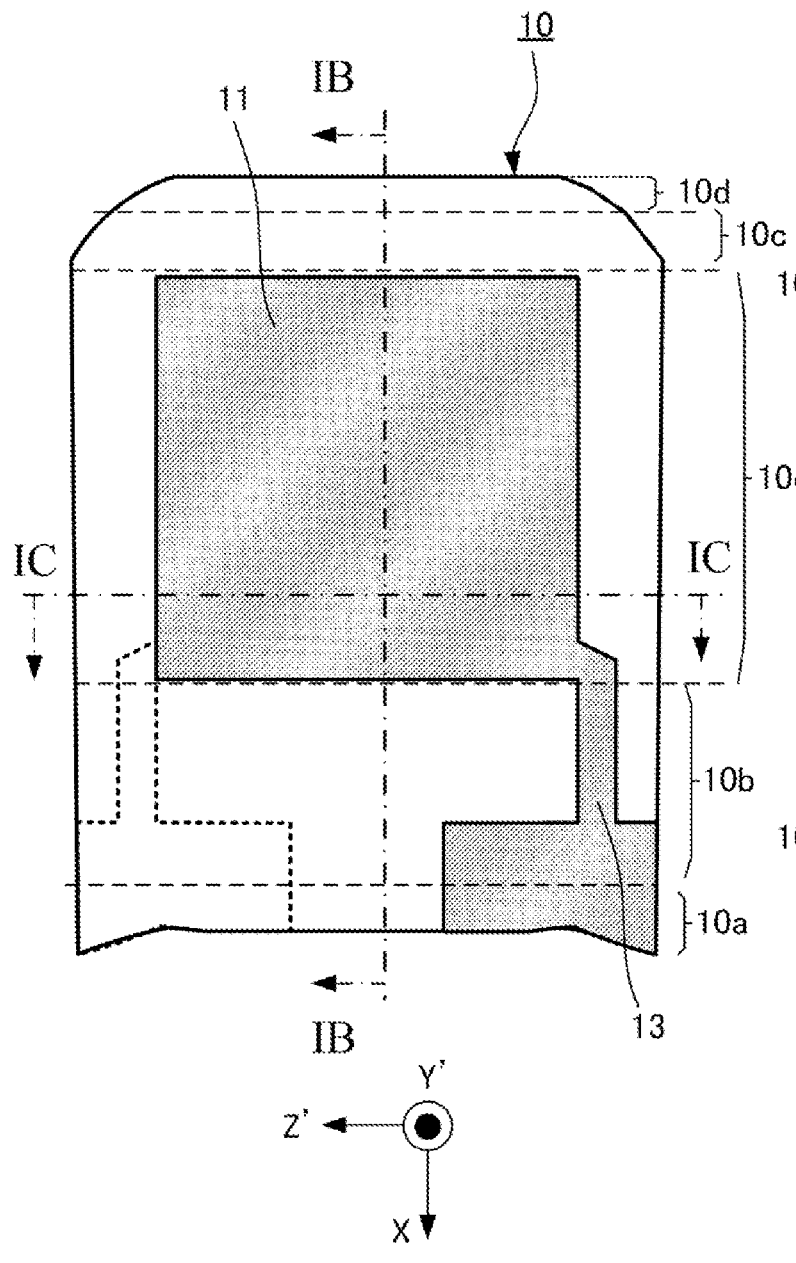
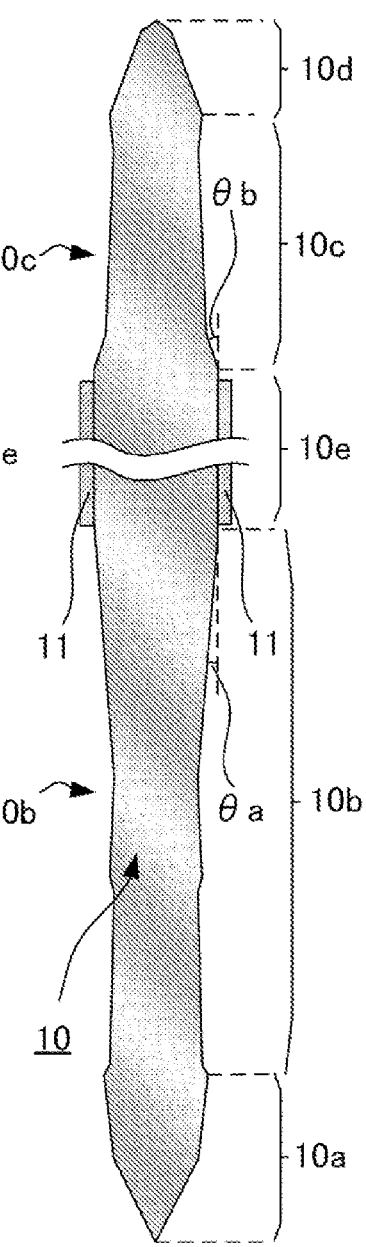
FIG. 1C
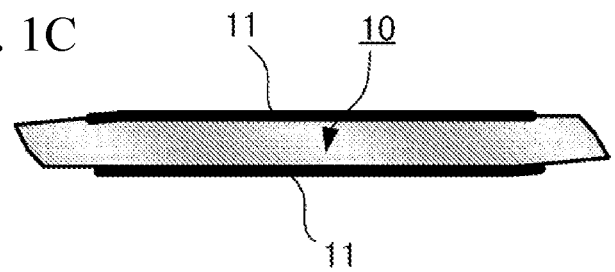

CRYSTAL UNIT AND MANUFACTURING METHOD THEREOF

CROSS-REFERENCE TO RELATED APPLICATIONS

This application is based on and claims priority under 35 U.S.C. § 119 to Japanese Patent Application No. 2017-153897, filed on Aug. 9, 2017, the entire content of which is incorporated herein by reference.

TECHNICAL FIELD

This disclosure relates to a crystal unit using an AT-cut crystal element and a manufacturing method of the crystal unit.

DESCRIPTION OF THE RELATED ART

As downsizing of an AT-cut crystal unit proceeds, it has become difficult to manufacture crystal elements for crystal units by a manufacturing method of mechanical processing. Accordingly, an AT-cut crystal element manufactured using a photolithography technique and a wet etching technique has been developed.

For example, Japanese Unexamined Patent Application Publication No. 2014-27505 has disclosed a crystal unit that uses an AT-cut crystal element manufactured by the above-described technique. Specifically, Paragraph 0053 and FIG. 6 in Japanese Unexamined Patent Application Publication No. 2014-27505 disclose a crystal unit where a side surface on a +X-side among side surfaces (X-surfaces) intersecting with an X-axis of a crystal is constituted of six surfaces and a side surface on a −X-side is constituted of two surfaces, and a part of this crystal unit is configured as a thick portion (mesa-shaped). This crystal unit can achieve a crystal unit that has a low crystal impedance (CI) value and an improved frequency versus temperature characteristic (Paragraph 0008 in Japanese Unexamined Patent Application Publication No. 2014-27505).

The crystal unit in Japanese Unexamined Patent Application Publication No. 2014-27505 has a mesa structure and includes a thick portion, an inclined portion connected to the thick portion, and a thin portion connected to the inclined portion. The inclined portion includes two inclined portions of a +X-side inclined portion (a crystal surface 133 in FIG. 6B in Japanese Unexamined Patent Application Publication No. 2014-27505) and a −X-side inclined portion (an inclined surface 23 in the identical drawing).

Then, it is described that an angle between an inclined surface of the +X-side inclined portion and a normal line of a principal surface of the thick portion is about 27° (fourth line to fifth line in Paragraph 0057 in Japanese Unexamined Patent Application Publication No. 2014-27505). Therefore, the +X-side inclined portion inclines toward the thin portion having an angle of about 63°. It is described that an angle between a crystal surface of the −X-side inclined portion and the normal line of the principal surface of the thick portion is about 55° (second line to third line in Paragraph 0055 in Japanese Unexamined Patent Application Publication No. 2014-27505). Therefore, the −X-side inclined portion inclines toward the thin portion having an angle of about 35°. In the case of Japanese Unexamined Patent Application Publication No. 2014-27505, as illustrated in FIG. 8, an etching resist mask is exclusively used for forming the thick portion.

Against this related art, it has been desired another preferred structure for a connecting part of the thick portion and the thin portion. It has been desired a method where the etching resist mask exclusive for forming the thick portion can be omitted.

A need thus exists for a crystal unit and a manufacturing method of the crystal unit which are not susceptible to the drawback mentioned above.

SUMMARY

According to an aspect of this disclosure, there is provided a crystal unit that includes an AT-cut crystal element that has a planar shape in a rectangular shape and a part as a thick portion. The crystal element includes a first end portion, a first depressed portion, the thick portion, a second depressed portion, and a second end portion in an order from a side of one short side in viewing a cross section taken along a longitudinal direction near a center of the short side. The first depressed portion is a depressed portion disposed from the thick portion toward the first end portion side, depressed with a predetermined angle θa and subsequently bulged, and connected to the first end portion. The second depressed portion is a depressed portion disposed from the thick portion toward the second end portion side, depressed with a predetermined angle θb and subsequently bulged, and connected to the second end portion.

BRIEF DESCRIPTION OF THE DRAWINGS

The foregoing and additional features and characteristics of this disclosure will become more apparent from the following detailed description considered with reference to the accompanying drawings, wherein:

FIG. 1A to FIG. 1C are explanatory drawings of an AT-cut crystal element 10 included in a crystal unit of an embodiment;

DETAILED DESCRIPTION

Figure 2A:
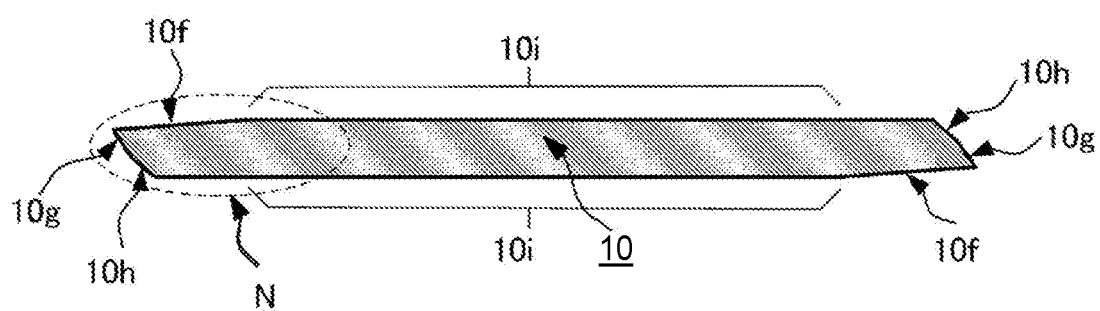
FIG. 2A and FIG. 2B are explanatory drawings of a side surface intersecting with especially a Z'-axis of the crystal element 10.

The following describes an embodiment of a crystal unit and a manufacturing method of the crystal unit according to the disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated here in some cases. Shapes, dimensions, materials, and a similar factor described in the following embodiment are merely preferable examples within the scope of the disclosure. Therefore, the disclosure is not limited to only the following embodiment.

1. Description of Crystal Unit

1-1. Structure

Figure 2B:
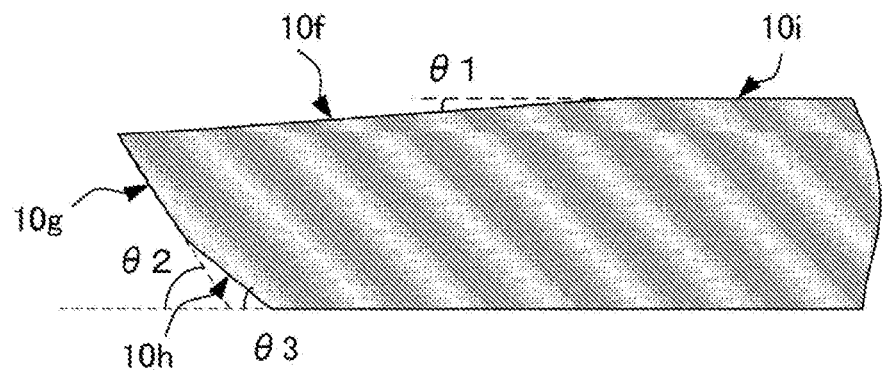

First, with reference to FIGS. 1A to 2B, an AT-cut crystal element 10 included in a crystal unit of the embodiment will be described. FIG. 1A is a plan view of the crystal element 10, FIG. 1B is a cross-sectional view of the crystal element 10 taken along the line IB-IB in FIG. 1A, FIG. 1C is a cross-sectional view of the crystal element 10 taken along the line IC-IC in FIG. 1A. FIG. 1B illustrates a first end portion 10a, a first depressed portion 10b, a second depressed portion 10c, and a second end portion 10d, which are features of the disclosure, enlarged for easy understanding, and illustrates a thick portion 10e while omitting a part of a region along a longitudinal direction of the crystal element 10 due to its limited space for the disclosure. FIG. 2A is an enlarged figure of FIG. 1C, and FIG. 2B is an enlarged figure of a part N in FIG. 2A.

Coordinate axes X, Y', and Z' illustrated in FIG. 1A are crystallographic axes of crystal in the AT-cut crystal element 10. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The crystal element 10 of this embodiment is an AT-cut crystal element that has a planar shape in a rectangular shape, a part as the thick portion 10e, a long side parallel to the X-axis of the crystal, a short side parallel to the Z'-axis of the crystal, and is formed from a crystal element having a predetermined direction angle.

Moreover, in viewing a cross section (namely the cross section taken along the line IB-IB) taken along the longitudinal direction near the center of the short side, the crystal element 10 includes the first end portion 10a, the first depressed portion 10b, the thick portion 10e, the second depressed portion 10c, and the second end portion 10d in this order from a side of one short side (in the case of FIGS. 1A to 1C, the +X-side short side).

Moreover, as illustrated in especially FIG. 1B, the first depressed portion 10b is a depressed portion that is disposed from the thick portion 10e toward the first end portion 10a side, depressed with a predetermined angle θa and subsequently bulged, and furthermore in this example, depressed a little and bulged again before connected to the first end portion 10a.

The second depressed portion 10c is a depressed portion that is disposed from the thick portion 10e toward the second end portion 10d side, depressed with a predetermined angle θb and subsequently depressed with an angle smaller than the angle θb, and subsequently bulged before connected to the second end portion 10d.

Here, the angle θa is an angle between a principal surface of the thick portion 10e and an inclined surface of the first depressed portion 10b on a thick portion 10e side, and is specifically 4 to 8°, and typically about 60. The angle θb is an angle between the principal surface of the thick portion 10e and an inclined surface of the second depressed portion 10c on a thick portion 10e side, and is specifically 14 to 18°, and typically about 16°. While these angles θa and θb have slight dispersion, experiments up to the present by inventors of the embodiment shows that the angle θa indicates 6±2° and the angle θb indicates 16±2° as described above.

As illustrated in FIG. 1B, the first end portion 10a is constituted of four surfaces and is formed to have a convex shape toward a +X-direction. The second end portion 10d is constituted of four surfaces and is formed to have a convex shape toward a −X-direction.

Here, dimensions of the long side and the short side of the crystal element 10, and respective dimensions of the first end portion 10a, the first depressed portion 10b, the second depressed portion 10c, the second end portion 10d, and the thick portion 10e along the longitudinal direction of the crystal element 10 may be configured to be any dimensions corresponding to a specification required to the crystal unit.

In the case of the crystal element 10 of this embodiment, the dimensions of the first end portion 10a, the first depressed portion 10b, the second depressed portion 10c, and the second end portion 10d along the longitudinal direction of the crystal element 10 are configured to be about 50 μm, about 180 μm, about 80 μm, and about 40 μm, respectively. Therefore, the dimension of the first depressed portion 10b is longer than the dimension of the second depressed portion 10c by more than two times.

In the case of the crystal element 10, as illustrated especially in FIG. 2B, each side surface (Z'-surface) intersecting with the Z'-axis of the crystal element 10 is a side surface constituted of three surfaces of a first surface 10f, a second surface 10g, and a third surface 10h. Moreover, the first surface 10f is a surface intersecting with a principal surface 10i of the crystal element 10, and a surface corresponding to a surface obtained by rotating the principal surface 10i by θ1 having the X-axis of the crystal as a rotation axis.

Furthermore, the crystal element 10 has the first surface 10f, the second surface 10g, and the third surface 10h intersecting in this order. Moreover, the second surface 10g is a surface corresponding to a surface obtained by rotating the principal surface 10i by θ2 having the X-axis of the crystal as a rotation axis, and the third surface 10h is a surface corresponding to a surface obtained by rotating the principal surface 10i by θ3 having the X-axis of the crystal as a rotation axis. The experiments by this applicant have shown that the angles θ1, θ2, and θ3 are preferably as follows: θ1=4°±3.50, θ2=−57±5°, and θ3=−42°±5°, and more preferably, θ1=4°±3°, θ2=−57°±3°, and θ3=−42°±3°. The angles θ1 to θ3 have been described in Japanese Unexamined Patent Application Publication No. 2016-197778 by this applicant, thus omitting the description here.

The side surface (Z'-surface) intersecting with the Z'-axis constituted of the predetermined three surfaces as described above preferably ensures reduction of unnecessary vibrations in a short side direction.

The crystal element 10 includes excitation electrodes 11 on front and back surfaces of the thick portion 10e, or on wider predetermined regions including the front and back surfaces, and furthermore, the crystal element 10 includes extraction electrodes 13 extracted from the excitation electrodes 11 to a side of one short side of the crystal element 10. The excitation electrode 11 and the extraction electrode 13 each can be formed of a laminated film of chrome and gold, typically.

Figure 3:
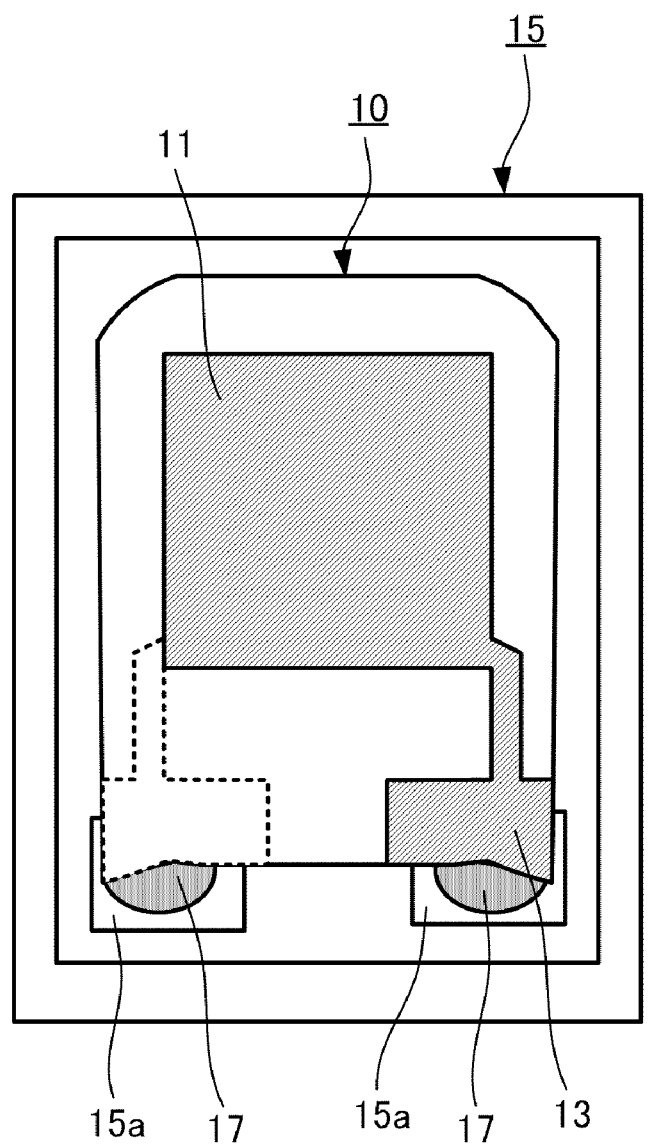
FIG. 3 is a plan view illustrating a state where the crystal element 10 is installed on a ceramic package.

As illustrated in FIG. 3, thus formed crystal element 10 is installed in, for example, a well-known ceramic package 15 at a position of the extraction electrode 13 by, for example, a silicone conductive adhesive 17. Furthermore, the ceramic package is sealed in a sealing state of vacuum, an inert gas atmosphere, or similar atmosphere with a predetermined lid member (not illustrated), thus configuring the crystal unit of the embodiment. For describing the fixed position of the crystal element 10 in detail, the crystal element 10 is fixed to adhesion pads 15a of the ceramic package 15 near the first end portion 10a by the conductive adhesive 17.

1-2. Experimental Result

A large number of crystal elements 10 having an oscillation frequency configured to a predetermined frequency were experimentally produced as the above-described crystal elements 10. Then, those crystal elements 10 were used to form the crystal units of a working example having the above-described installation structure and the sealing structure.

Figure 4:
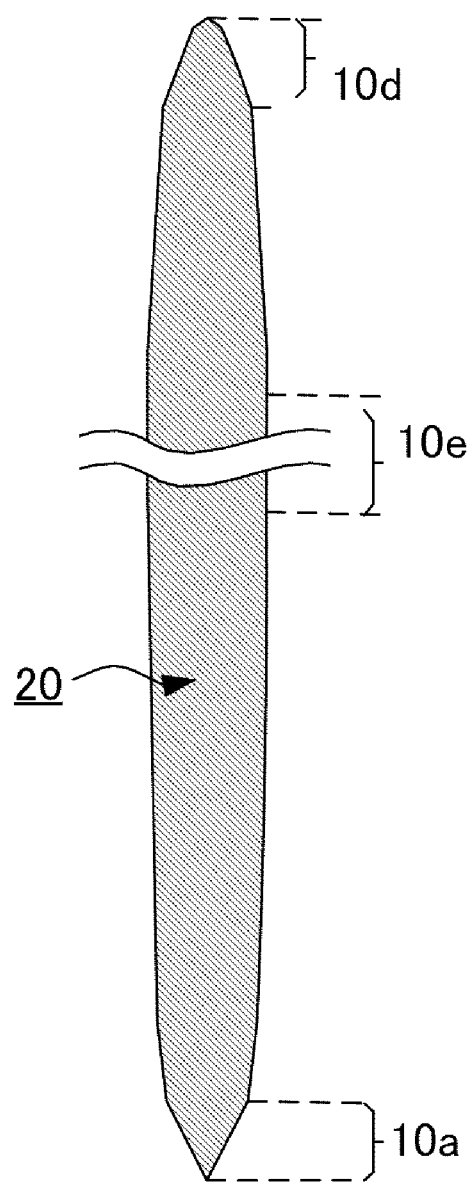
FIG. 4 is an explanatory drawing of a crystal element 20 of a comparative example.

On the other hand, as illustrated in a cross-sectional view in FIG. 4 similar to FIG. 1B, a large number of crystal elements 20 each having a configuration where the first depressed portion 10b and the second depressed portion 10c disposed in the working example are not disposed were experimentally produced as crystal elements 20 of a comparative example. Then, those crystal elements 20 were used to form crystal units of the comparative example having the above-described installation structure and the sealing structure.

Next, frequency versus temperature characteristics and crystal impedance (CI) temperature characteristics were each measured in a temperature range of −40 to +100° C. on 40 pieces of the crystal units of the working example and the comparative example. Here, the CI temperature characteristic means a characteristic that indicates variation of the CI relative to the measured temperature, and property of the crystal unit is improved as the CI variation relative to the temperature decreases. Apart from the CI temperature characteristic, the property of the crystal unit is improved as the CI itself decreases.

Therefore, for determining the quality the structure of the embodiment, first, Table 1 indicates an average value of 40 pieces of the crystal units in the CI at the temperature of 25° C. and a standard deviation σ for each of the working example and comparative example. Table 1 indicates the result of the crystal unit of the working example as 1.00, and indicates values of the comparative example with normalized values having the result of the working example as a reference. Table 1 indicates that the comparative example has the average value 1.23 times poorer and the standard deviation σ 1.76 times poorer than the working example, thus showing that the structure of the working example is excellent.

TABLE 1

CI COMPARISON IN 25° C.

|  | WORKING EXAMPLE | COMPARATIVE EXAMPLE |
|---|---|---|
| AVERAGE VALUE | 1.00 | 1.23 |
| σ | 1.00 | 1.76 |

Count of Samples: 40 Pieces Each

Figure 5:
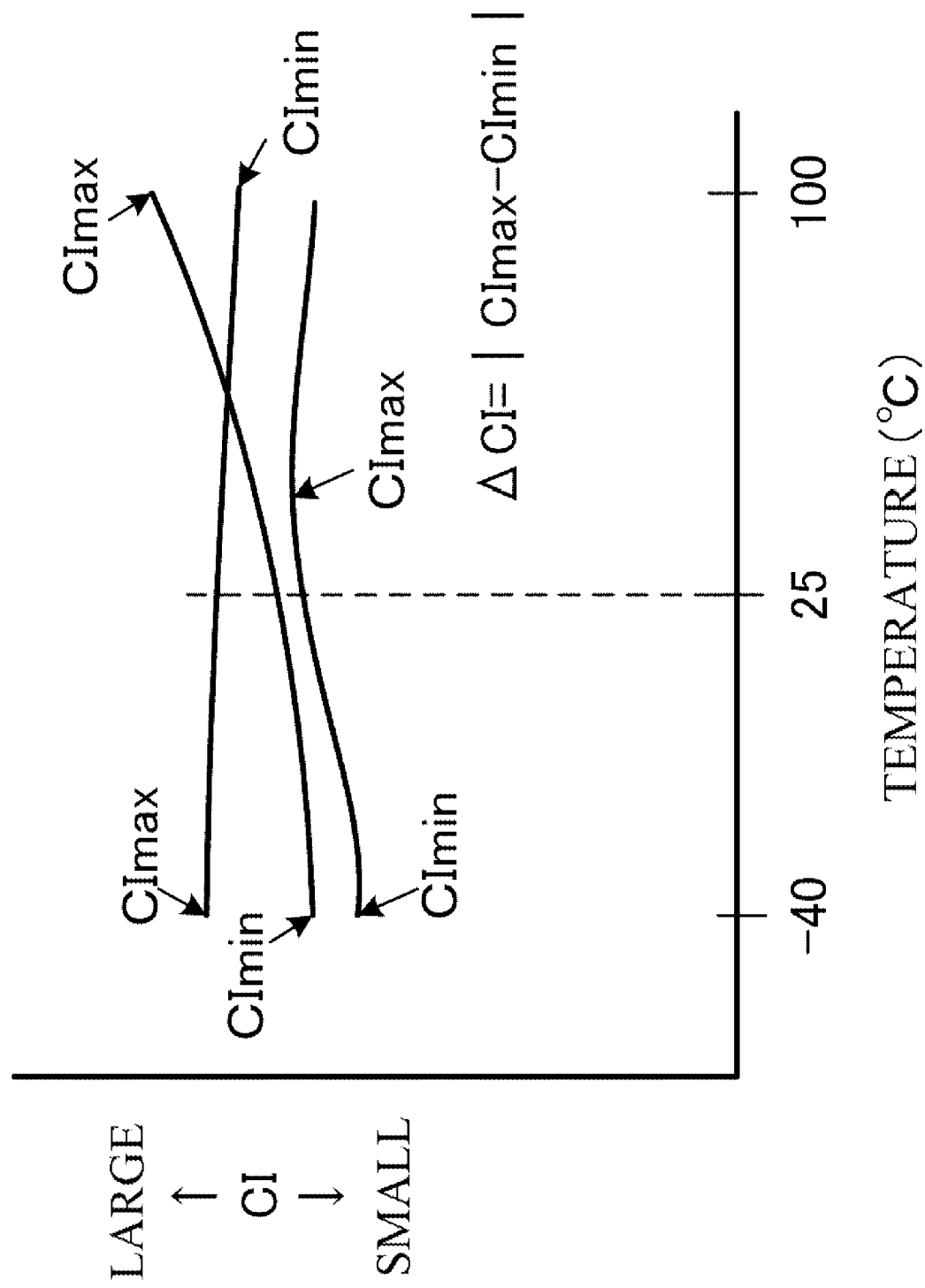
FIG. 5 is a supplementary drawing describing CI characteristics of respective samples of a working example and the comparative example.

Next, the results are compared between the working example and the comparative example on CI variation amounts ΔCI in the CI temperature characteristic. FIG. 5 is an explanatory drawing for further understanding the CI variation amount ΔCI. In the temperature characteristic of each of the total 80 pieces of the crystal units of the working example and the comparative example, an absolute value ΔCI of a difference between a CI maximum value CImax and a CI minimum value CImin is obtained. Then, Table 2 indicates an average value of 40 pieces in ΔCI and a standard deviation σ for each of the working example and comparative example. Table 2 indicates that the comparative example has the average value two times poorer and the standard deviation σ 1.26 times poorer than the working example, thus showing that the structure of the working example is excellent.

TABLE 2

ΔCI COMPARISON IN CI TEMPERATURE CHARACTERISTIC

|  | WORKING EXAMPLE | COMPARATIVE EXAMPLE |
|---|---|---|
| AVERAGE VALUE | 1.00 | 2.00 |
| σ | 1.00 | 1.26 |

Count of Samples: 40 Pieces Each

2. Description of Manufacturing Method

Next, an embodiment of a manufacturing method of the crystal unit will be described with reference to FIG. 6A to FIG. 8C.

A large number of the crystal elements 10 of the embodiment can be manufactured from a quartz-crystal wafer by a photolithography technique and a wet etching technique. Therefore, the following drawings used for the description of an exemplary manufacturing method include plan views of a quartz-crystal wafer 10w and plan views illustrating an enlarged part M of the quartz-crystal wafer 10w. Furthermore, the drawings used for the description of the exemplary manufacturing method include cross-sectional views of the crystal element 10 as well. Each cross-sectional view illustrates a cross section taken along the line VIC-VIC, the line VIIC-VIIC, or the line VIIIC-VIIIC in the corresponding plan view.

Figure 6A:
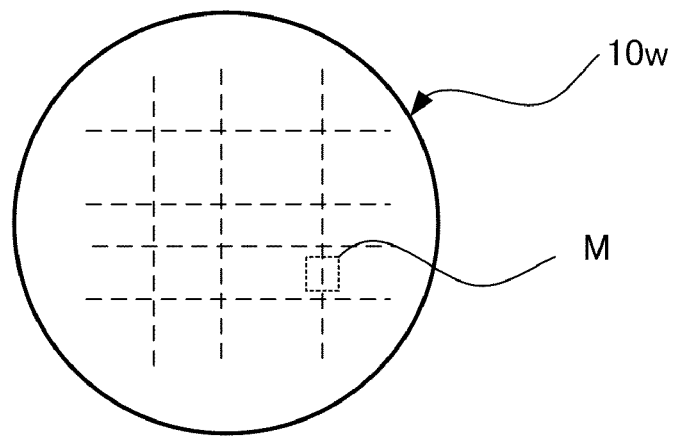
FIG. 6A to FIG. 6C are explanatory drawings of an exemplary manufacturing method of the crystal element 10.
Figure 6B:
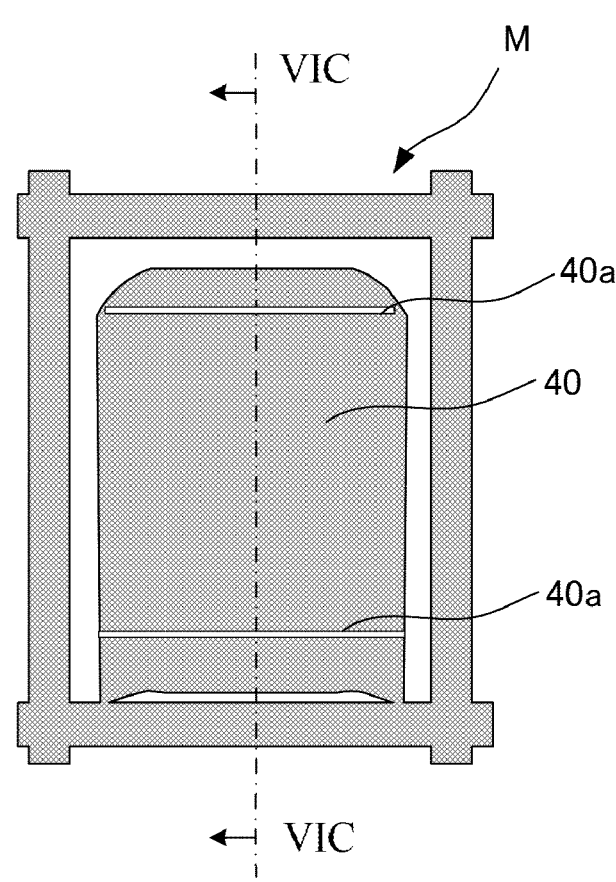
Figure 6C:
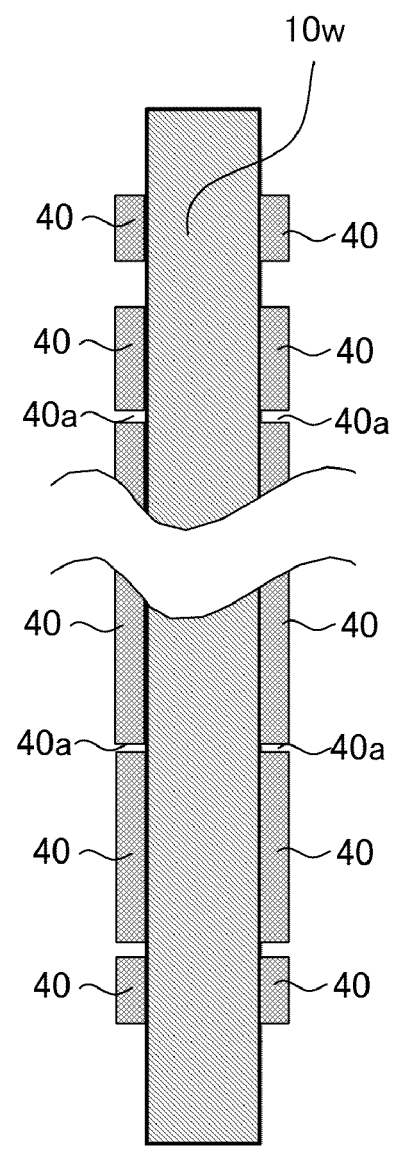

First, the quartz-crystal wafer 10w is prepared (FIG. 6A). While the oscillation frequency of the AT-cut crystal element 10 is, as well known, almost determined by the thickness of the principal surface (X-Z' surface) part of the crystal element 10, the quartz-crystal wafer 10w to be prepared is a wafer thicker than a final thickness of the crystal element 10.

Next, the well-known film forming technique and photolithography technique are used to form wet etching resist masks 40, which are masks to form an outer shape of the crystal element 10, on both front and back surfaces of the quartz-crystal wafer 10w. The wet etching resist masks 40 according to the embodiment are configured of a part corresponding to the outer shape of the crystal element 10, a frame part that holds each crystal element 10, and a connecting part that connects the crystal element 10 to the frame part. However, in this embodiment, the wet etching resist mask 40 is formed such that regions corresponding to the above-described respective first depressed portion 10b and second depressed portion 10c each have a part that includes an opening 40a. The opening 40a does not pass through the quartz-crystal wafer 10w, but a wet etching solution can enter the opening 40a to an extent that the quartz-crystal wafer 10w is etched by a desired amount. Specifically, for example, the wet etching resist mask 40 formed of the laminated film of a chrome film and a gold film, and the wet etching resist mask 40 where this metal film is removed from the above-described predetermined part form the opening 40a.

The opening 40a has a dimension along the thickness direction of the crystal element 10 such that the opening 40a does not pass through the quartz-crystal wafer 10w, but a wet etching solution can enter the opening 40a to an extent that the quartz-crystal wafer 10w is etched by a desired amount as described above, and the dimension is typically a few μm, for example, 2 μm. However, this value can be changed corresponding to the thickness of the quartz-crystal wafer 10w, the depths and the sizes of the first depressed portion 10b and the second depressed portion 10c, and similar factor. The dimension of the opening 40a along the short side direction of the crystal element 10 is preferred to be a dimension similar to the width dimension of the crystal element 10. However, this dimension can be changed to be wider or narrower corresponding to the thickness of the quartz-crystal wafer 10w, the sizes of the first depressed portion 10b and the second depressed portion 10c. While the number of the openings 40a is one for each of both end regions of the crystal element 10 in the example of FIGS. 6A to 6C, not limiting to this, a plurality of openings 40a may be disposed, or one opening 40a may be disposed on one region while a plurality of openings 40a may be disposed on the other region. While the opening 40a has a planar shape in an extremely elongated rectangular shape in the example of FIGS. 6A to 6C, this shape may be changed as well.

Next, the quartz-crystal wafer 10w on which the wet etching resist mask 40 has been formed is dipped in the wet etching solution for a predetermined period. For the etching solution, a hydrofluoric acid-based etchant is used. The predetermined period is a period when the etching solution can pass through the quartz-crystal wafer 10w so as to obtain an outline of an outer shape of the crystal element 10 plus something extra.

In this etching, since the etching solution sufficiently enters the opening 40a of the quartz-crystal wafer 10w nearby a forming scheduled region of the crystal element 10 and is diffused, the etching proceeds to sufficiently pass through the quartz-crystal wafer 10w itself. On the other hand, since the opening 40a part has a narrow opening dimension, the wet etching solution enters the quartz-crystal wafer 10w part under the opening 40a little by little. Therefore, the wet etching solution does not lead to pass through the quartz-crystal wafer 10w, and the regions of the openings 40a and the quartz-crystal wafer 10w part under the mask nearby the regions of the openings 40a are etched.

Figure 7A:
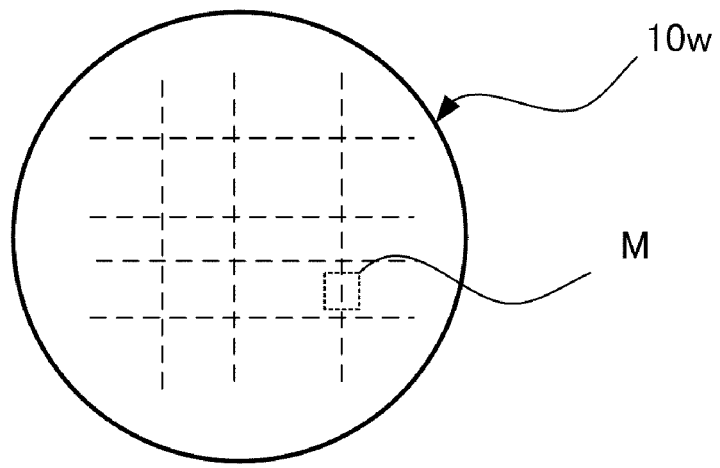
FIG. 7A to FIG. 7C are explanatory drawings of the exemplary manufacturing method of the crystal element 10 following FIG. 6A to FIG. 6C.
Figure 7B:
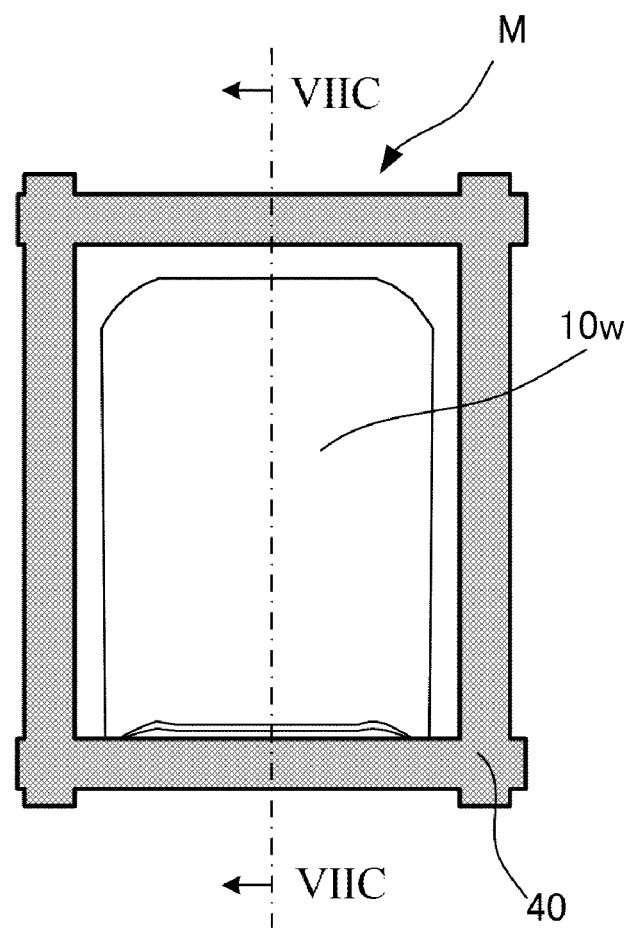
Figure 7C:
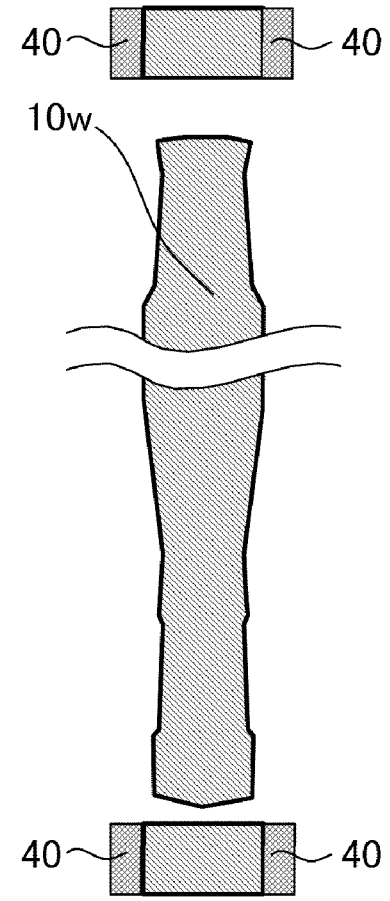

FIGS. 7A to 7C illustrate a state of a sample where the above-described outer shape etching has terminated, and illustrates the wet etching resist mask 40 removed except the frame part. The quartz-crystal wafer 10w is obtained in an intermediate state before the first end portion 10a, the first depressed portion 10b, the thick portion 10e, the second depressed portion 10c, and the second end portion 10d are each completed.

Figure 8A:
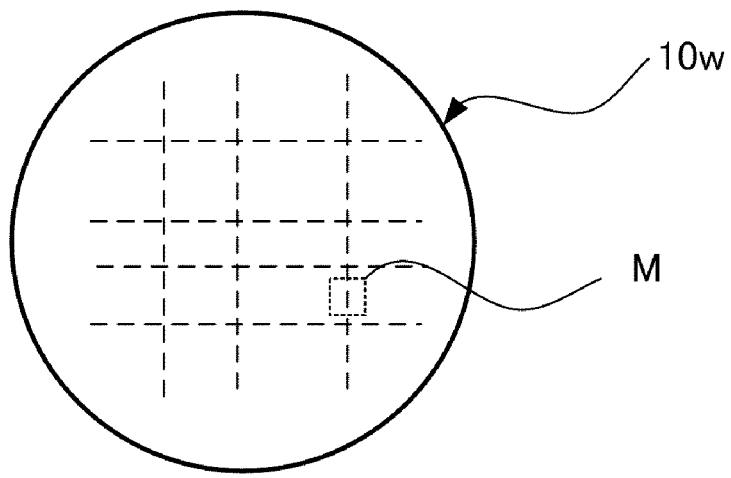
FIG. 8A to FIG. 8C are explanatory drawings of the exemplary manufacturing method of the crystal element 10 following FIG. 7A to FIG. 7C.
Figure 8B:
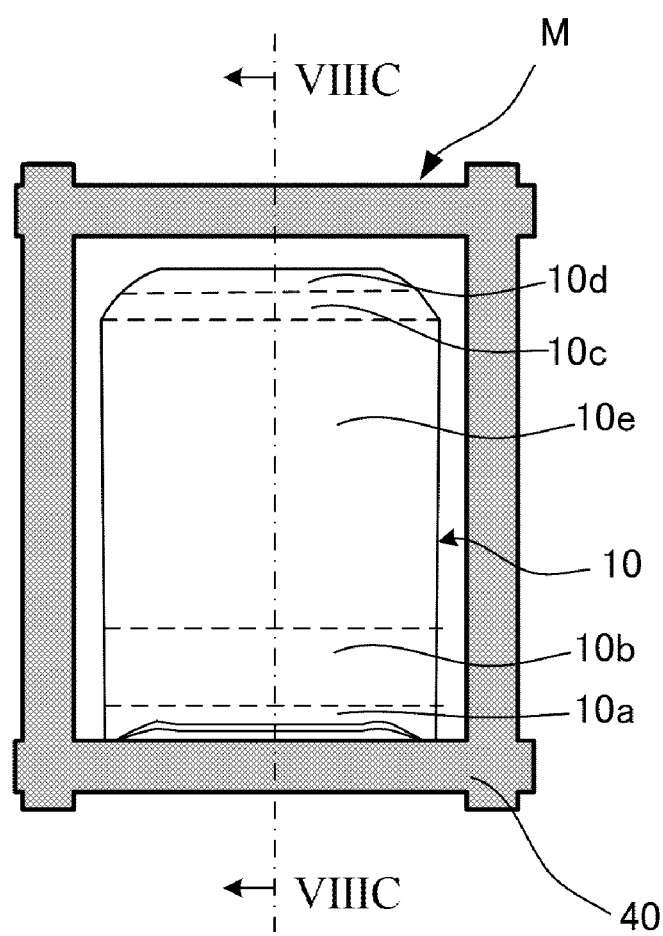
Figure 8C:
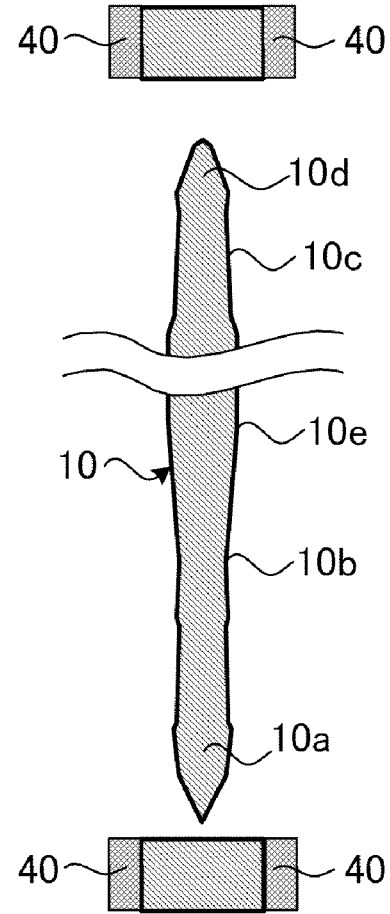

Next, this quartz-crystal wafer 10w in this intermediate state is dipped again in the etching solution mainly composed of hydrofluoric acid for a predetermined period. Here, the predetermined period is a period during which the thickness of the forming scheduled region for the thick portion 10e of the crystal element 10 can satisfy a specification of the oscillation frequency required to the crystal element 10, and the first to third surfaces 10f to 10h can be formed on a side surface intersecting with the Z'-axis of the crystal element 10. When this etching terminates, the main part of the crystal element 10 including the first end portion 10a, the first depressed portion 10b, the thick portion 10e, the second depressed portion 10c, and the second end portion 10d is completed as illustrated in FIGS. 8A to 8C.

Next, the remaining part of the wet etching resist mask 40 is removed from the quartz-crystal wafer 10w after the above-described etching is performed to expose the entire crystal surface (not illustrated). After that, the well-known film formation method is used to form a metal film (not illustrated) for forming excitation electrodes 11 and extraction electrodes 13 of the crystal unit on the entire surface of the quartz-crystal wafer 10w. Next, the well-known photolithography technique and metal etching technique are used to process the metal film, thus the quartz-crystal wafer 10w that includes a large number of the crystal elements 10 illustrated in FIG. 1A to 1C is completed.

Next, an appropriate external force is applied to the connecting portion of each crystal element 10 of the quartz-crystal wafer 10w to separate the crystal element 10 from the quartz-crystal wafer 10w, thus separating into individual pieces. Thus, formed crystal element 10 is installed in the container and sealed as described above, thus providing the crystal unit of the embodiment as illustrated in FIG. 3.

In the above-described manufacturing method, the predetermined opening 40a is disposed to the wet etching resist mask 40 to perform the outer shape etching, thus ensuring simultaneously forming a mesa structure when the outer shape etching is performed. Accordingly, a novel mesa structure can be formed without using a mask exclusive for forming the mesa structure.

According to a manufacturing method of a crystal unit of this application, the crystal unit includes an AT-cut crystal element. The AT-cut crystal element has a planar shape in a rectangular shape and a part as a thick portion. The crystal element includes a first end portion, a first depressed portion, the thick portion, a second depressed portion, and a second end portion in an order from a side of one short side in viewing a cross section taken along a longitudinal direction near a center of the short side. The first depressed portion is a depressed portion disposed from the thick portion toward the first end portion side. The first depressed portion is depressed with a predetermined angle θa and subsequently bulged. The first depressed portion is connected to the first end portion. The second depressed portion is a depressed portion disposed from the thick portion toward the second end portion side. The second depressed portion is depressed with a predetermined angle θb and subsequently bulged. The second depressed portion is connected to the second end portion. The manufacturing method of the crystal unit includes preparing, forming, and dipping. The preparing is preparing a quartz-crystal wafer for manufacturing a large count of the crystal elements. The forming is forming a wet etching resist mask on front and back surfaces of the quartz-crystal wafer. The wet etching resist mask forms an outer shape of the crystal element. The wet etching resist mask has an opening on a part of a region corresponding to each of the first depressed portion and the second depressed portion. The opening does not pass through the quartz-crystal wafer while a wet etching solution is allowed to enter the opening to an extent that the quartz-crystal wafer is etched by a desired amount. The dipping is dipping the quartz-crystal wafer on which the wet etching resist mask is formed in a wet etching solution for a predetermined period.

The crystal unit in this application includes a common crystal unit, a crystal unit installed in a package with an oscillator circuit to constitute a crystal oscillator, a crystal unit that includes various temperature sensors such as a thermistor and a PN diode, and similar crystal unit.

The crystal unit of the embodiment provides the crystal unit that has the depressed portion from the thick portion on each of both sides along the longitudinal direction of the crystal element. The depressed portion provides a novel mesa structure where the crystal element has the thickness once decreased from the thick portion toward the end portion of the crystal element and subsequently increased. With this mesa structure, vibration is properly confined to the thick portion compared with a simple mesa structure. In view of this, the improvement of the characteristics of the crystal unit is ensured.

According to the manufacturing method of the crystal unit of the embodiment, the predetermined opening is disposed on the mask for processing the outer shape of the crystal element, thus ensuring the simultaneous processing on the first depressed portion and the second depressed portion in the processing of the outer shape of the crystal element. Accordingly, the crystal unit that has the desired thick portion can be formed without using a mask exclusive for forming the thick portion.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal unit comprising
an AT-cut crystal element,
comprising a first end portion, a first depressed portion, a thick portion, a second depressed portion, and a second end portion in an order from a side of one short side in viewing a cross section taken along an X-axis of the AT-cut crystal element near a center of the one short side, wherein a longitudinal direction of the AT-cut crystal element is along the X-axis thereof,
wherein the first depressed portion is a depressed portion disposed from the thick portion toward the first end portion side, depressed with a predetermined angle θa between a principle surface of the thick portion and an inclined surface of the first depressed portion on a side of the thick portion and subsequently bulged, and connected to the first end portion, and
the second depressed portion is a depressed portion disposed from the thick portion toward the second end portion side, depressed with a predetermined angle θb between the principle surface of the thick portion and an inclined surface of the second depressed portion on another side of the thick portion and subsequently bulged, and connected to the second end portion,
wherein the AT-cut crystal element has a long side parallel to the X-axis and the one short side parallel to a Z'-axis of the crystal, the first end portion is positioned on a +X-side, the predetermined angle θa is 6±2°, and the predetermined angle θb is 16±2°.

2. A manufacturing method of a crystal unit, wherein:
the crystal unit includes an AT-cut crystal element, the AT-cut crystal element comprises
a first end portion, a first depressed portion, a thick portion, a second depressed portion, and a second end portion in an order from a side of one short side in viewing a cross section taken along an X-axis of the AT-cut crystal element near a center of the one short side, wherein a longitudinal direction of the AT-cut crystal element is along the X-axis thereof,
wherein the first depressed portion is a depressed portion disposed from the thick portion toward the first end portion side, the first depressed portion being depressed with a predetermined angle θa between a principle surface of the thick portion and an inclined surface of the first depressed portion on a side of the thick portion and subsequently bulged, the first depressed portion being connected to the first end portion,
the second depressed portion is a depressed portion disposed from the thick portion toward the second end portion side, the second depressed portion being depressed with a predetermined angle θb between the principle surface of the thick portion and an inclined surface of the second depressed portion on another side of the thick portion and subsequently bulged, the second depressed portion being connected to the second end portion, the manufacturing method of the crystal unit comprising:
preparing a quartz-crystal wafer for manufacturing a large number of the AT-cut crystal elements;
forming a wet etching resist mask on front and back surfaces of the quartz-crystal wafer, the wet etching resist mask forming an outer shape of the AT-cut crystal element, the wet etching resist mask having an opening on a part of a region corresponding to each of the first depressed portion and the second depressed portion, the opening not passing through the quartz-crystal wafer while a wet etching solution is allowed to enter the opening to an extent that the quartz-crystal wafer is etched by a desired amount; and
dipping the quartz-crystal wafer on which the wet etching resist mask is formed in the wet etching solution for a predetermined period.

3. The manufacturing method of the crystal unit according to claim 2, further comprising:
removing the wet etching resist mask after dipping the quartz-crystal wafer in the wet etching solution for a predetermined period; and
dipping the quartz-crystal wafer after removing the wet etching resist mask in a wet etching solution for a predetermined period.

* * * * *